United States Patent
Kyösti et al.

(10) Patent No.: US 9,787,414 B2
(45) Date of Patent: Oct. 10, 2017

(54) OVER-THE AIR TEST

(75) Inventors: Pekka Kyösti, Jokirinne (FI); Tommi Laitinen, Espoo (FI)

(73) Assignee: Keysight Technologies Singapore (Holdings) Pte. Ltd., Singapore (SG)

( * ) Notice: Subject to any disclaimer, the term of this patent is extended or adjusted under 35 U.S.C. 154(b) by 0 days.

(21) Appl. No.: 13/259,505

(22) PCT Filed: Jul. 6, 2011

(86) PCT No.: PCT/FI2011/050637
§ 371 (c)(1),
(2), (4) Date: Oct. 25, 2011

(87) PCT Pub. No.: WO2013/004887
PCT Pub. Date: Jan. 10, 2013

(65) Prior Publication Data
US 2014/0122049 A1    May 1, 2014

(51) Int. Cl.
| | |
|---|---|
| G06F 17/50 | (2006.01) |
| H04B 15/00 | (2006.01) |
| G01R 29/08 | (2006.01) |
| H04B 17/00 | (2015.01) |
| H01Q 3/26 | (2006.01) |

(Continued)

(52) U.S. Cl.
CPC ......... *H04B 15/00* (2013.01); *G01R 29/0821* (2013.01); *H01Q 3/267* (2013.01); *H04B 17/0085* (2013.01); *H04B 17/391* (2015.01); *H04B 17/3912* (2015.01); *H04B 17/21* (2015.01); *H04B 17/3911* (2015.01)

(58) Field of Classification Search
CPC .................................................. H04B 17/3912
USPC ............................................................ 703/13
See application file for complete search history.

(56) References Cited

U.S. PATENT DOCUMENTS

| | | | |
|---|---|---|---|
| 5,862,455 A | 1/1999 | Martin et al. | |
| 2008/0056340 A1* | 3/2008 | Foegelle ....................... | 375/224 |
| 2011/0134001 A1 | 6/2011 | Sakata et al. | |

FOREIGN PATENT DOCUMENTS

| | | |
|---|---|---|
| CN | 101605350 | 12/2009 |
| CN | 101997618 | 3/2011 |

(Continued)

OTHER PUBLICATIONS

Toivanen et al.; "Calibration of multi-probe antenna measurement system using test zone field compensation," Antennas and Propagation, 2009. EuCAP 2009. 3rd European Conference on; 2009; pp. 2916-2920.*

(Continued)

*Primary Examiner* — Hugh Jones

(57) ABSTRACT

A radio channel generator has a radio channel model predistorted on the basis of a predetermined chamber model. An emulator receives the weights of the radio channel model predistorted on the basis of the chamber model. A transmitter feeds a communication signal to the emulator. The emulator weights the communication signal with the radio channel model predistorted on the basis of the chamber model. The over-the-air antennas receive the weighted communication signal and transmit it to a device under test. The chamber model is based on a simulation or a measurement. The chamber model takes into account undesired interactions in the over-the-air chamber for cancelling them during the radio channel emulation.

23 Claims, 4 Drawing Sheets

(51) Int. Cl.
H04B 17/391 (2015.01)
H04B 17/21 (2015.01)

(56) References Cited

FOREIGN PATENT DOCUMENTS

| CN | 101998455 | | 3/2011 | |
|---|---|---|---|---|
| WO | 9320626 | A1 | 10/1993 | |
| WO | WO03041308 | A1 | 5/2003 | |
| WO | WO2010040887 | * | 4/2010 | ............ H04B 17/00 |
| WO | WO2011051537 | A1 | 5/2011 | |
| WO | 2012117147 | A1 | 9/2012 | |

OTHER PUBLICATIONS

Laitinen et al.; "Spherical measurement system for determination of complex radiation patterns of mobile terminals," Electronics Letters , vol. 40, No. 22, pp. 1392-1394, 2004.*
Dashti et al.; "Antenna radiation pattern influence on UWB ranging accuracy," Antennas and Propagation (EuCAP), 2010 Proceedings of the Fourth European Conference on , vol., No., pp. 1-5, Apr. 2010.*
Feng et al. "Simulation based comparison of metrics and measurement methodologies for OTA test of MIMO terminals," Antennas and Propagation (EuCAP), 2010 Proceedings of the Fourth European Conference on , vol., No., pp. 1,5, Apr. 12-16, 2010.*
PCT search FI2003 000929; pp. 1-5; 2005.*
PCT search FI2009 050471; pp. 1-7; 2010.*
PCT search FI2010 050419; pp. 1-8; 2010.*
Anon: Discover StarMIMO: The clear answer to MIMO testing (product brochure); one page; May 8, 2010.*
STARMIMO_BD_V3 May 2010 Microwavevision brochure; pp. 1-6.*
Hanley: Press Release; EB and SATIMO Unite Their Expertise in MIMO OTA Testing; May 2010; pp. 1-2.*
Scannavini et al.: OTA Throughput Measurements by Using Spatial Fading Emulation Technique; 2010 Proceedings of the Fourth EuCAP, Apr. 2010; pp. 1-5.*
Scannavini et al.: Practical Considerations on MIMO OTA testing; COST 2100 TD(09) 854 Valencia, Spain; May 2009; pp. 1-9.*
Kyosti et al.: MIMO OTA test concept with experimental and simulated verification; 2010 Proceedings of the Fourth EuCAP, Apr. 2010; pp. 1-5.*
Kyosti et al.: Channel Modelling for Radiated Testing of MIMO Capable Terminals; ICT-MobileSummit 2009 Conference Proceedings Paul Cunningham and Miriam Cunningham (Eds) IIMC International Information Management Corporation, 2009; pp. 1-8.*
Heino (ed): D5.3: WINNER+ Final Channel Models; Project No. CELTIC / CP5-026; Project title: Wireless World Initiative New Radio—WINNER;Jun. 30, 2010; 107 pages.*
Toivanen, et al., "Modified Test Zone Field Compensation for Small-Antenna Measurements," IEEE Transactions on Antennas and Propagation, pp. 3471-3479, vol. 58(11), Nov. 2010.

Toivanen et al., "Reproduction of Arbitrary Multipath Environments in Laboratory Conditions", IEEE Transactions on Instrumentation and Measurement, vol. 60, No. 1, pp. 275-281(Jan. 2011).
Toivanen et al., "Calibration of Multi-Probe Antenna Measurement System Using Test Zone Field Compensation", 3rd European Conference on Antennas and Propagation (EuCAP 2009), Berlin, Germany, pp. 2916-2920 (Mar. 23-27, 2009).
Hallbjorner et al., "Measurement Uncertainty in Multipath Simulators Due to Scattering within the Antenna Array-Theoretical Model Based on Mutual Coupling", IEEE Antennas and Wireless Propagation Letters, vol. 9, pp. 1103-1106(2010).
Ville Mottonen, International Search Report for corresponding International Application No. PCT/FI2011/050637, pp. 1-6 (Apr. 5, 2012).
First China Office Action dated Jan. 6, 2015, regarding China Application 201180072091.4, 6 pp.
Elektrobit et al: "TP: Test Plan for Anechoic Chamber Based MIMO OTA Methods," 3GPP Draft; R4-102241, 3rd Generation Partnership Project (3GPP), Mobile Competence Centre; 650, Route Des Lucioles; F-06921 Sophia-Antipolis Cedex France, vol. RAN WG4, No. Montreal, Canada; May 26, 2010, XP050427246, [retrieved on May 26, 2010 * paragraph [06.2]-paragraph [82.11].
Supplementary EP Search Report and EP Search Opinion dated Mar. 5, 2015, regarding EP11869166.6, 8 pp.
Second Office Action dated Jun. 4, 2015 regarding China Application No. CN201180072091.4, 3 pp.
Gan et al., "The FPGA Implementation of Short-Wave Channel Model", Chinese Journal of Electronics, vol. 12. No. 1. Jan. 2003, pp. 25-28.
Heino, "D5.3: Winner+Final Channel Models", Wireless World Initiative New Radio-Winner, Jun. 30, 2010, pp. 80-93.
Meinila et al., "D5.3: Winner+ Final Channel Models", Jun. 30, 2010, pp. 1-107.
International Preliminary Report on Patentability dated Oct. 10, 2005 for Application No. PCT/FI2003/000929, 5 pages.
International Preliminary Report on Patentability dated Jan. 7, 2014 for International Application No. PCT/FI2011/050637, 8 pages.
Written Opinion dated Apr. 5, 2012 for International Application No. PCT/FI2011/050637, 7 pages.
Notice of Allowance dated Nov. 10, 2015 in Chinese Patent Application No. 201180072091.4 (Unofficial/non-certified translation provided by foreign agent included), 4 pages.
International Search Report dated Apr. 5, 2012 for International Application No. PCT/FI2011/050637, 6 pages.
Machine translation of CN101605350, published Dec. 16, 2009, 17 pages.
Machine translation of CN101997618, published Mar. 30, 2011, 9 pages.
Machine translation of CN101998455, published Mar. 30, 2011, 10 pages.
Kolu et al., "A real-time simulator for MIMO radio channels", IEEE, 2002, pp. 568-572.
Jamsa et al., "Real-Time Simulation of Adaptive Array Antenna using Broadband Vector Channel Simulator", IEEE, 2002, pp. 188-192.
Stephenne et al., "A New Multi-Path Vector Channel Simulator for the Performance Evaluation of Antenna Array Systems", IEEE, 1997, pp. 1125-1129.

* cited by examiner

OVER-THE AIR TEST

CROSS-REFERENCE TO RELATED APPLICATION

This application is a National Phase application of International Application No. PCT/FI2011/050637, filed Jul. 6, 2011, which is incorporated by reference herein in its entirety.

BACKGROUND

Field

The invention relates to over-the-air testing of a device in an anechoic chamber.

Description of the Related Art

When a radio frequency signal is transmitted from a transmitter to a receiver, the signal propagates in a radio channel along one or more paths having different angles of arrivals, signal delays, polarizations and powers. Also a frequency may change due to the Doppler effect. These changes may cause variation in signal strength and fadings of different durations. In addition, noise and interference due to other transmitters interfere with the radio connection.

A transmitter and a receiver can be tested using a radio channel emulator emulating real circumstances. In a digital radio channel emulator, a radio channel is usually modelled with an FIR filter (Finite Impulse Response).

Communication between a DUT (Device Under Test) and a base station of a radio system can be tested using an OTA (Over-The-Air) test, where a real DUT, such a subscriber terminal, is surrounded by a plurality of antennas coupled with an emulator in a chamber which has as low echoes as possible. The emulator may be coupled to or act as a base station and emulate propagation paths between the subscriber terminal and the base station according to a channel model by generating independent Rayleigh faded signals, for example. OTA antennas transmit pre-processed communication signals to the DUT on the basis of weights determined by the emulated radio channel.

However, the OTA chamber has surfaces such as walls, cables and antenna stands which reflect the signals transmitted by the OTA antennas. Often the OTA antennas themselves cause echoes in the chamber. The unwanted reflections cause distortion to the emulated radio channel and deteriorate the quality of the emulation. On the other hand, it is technically very challenging to make the OTA chamber anechoic enough for the radio channel emulation, particularly with a moderate budget. Hence, there is need for a new approach to perform emulation in the OTA chamber.

SUMMARY

The following presents a simplified summary of the invention in order to provide a basic understanding of some aspects of the invention. This summary is not an extensive overview of the invention. Its purpose is to present some concepts of the invention in a simplified form as a prelude to the more detailed description that will be presented below.

An aspect of the invention relates to an apparatus.

A further aspect of the invention relates to an emulation system.

A further aspect of the invention relates to a method.

A further aspect of the invention relates to a method of performing radio channel emulation.

A further aspect of the invention relates to a measurement arrangement.

A further aspect of the invention relates to a simulation of a measurement arrangement.

The invention enables more accurate results in an OTA chamber. The invention also enables a use of an OTA chamber which has more echoes and thus more distortion than otherwise possible or desirable.

Although various aspects, embodiments and features of the invention are recited independently, it should be appreciated that all combinations of the various aspects, embodiments and features of the invention are possible and within the scope of the present invention as claimed.

BRIEF DESCRIPTION OF THE DRAWINGS

In the following, the invention will be described in greater detail by means of exemplary embodiments with reference to the attached drawings, in which.

DETAILED DESCRIPTION

Exemplary embodiments will be described more fully hereinafter with reference to the accompanying drawings, in which some embodiments are shown. Although the specification may refer to "an", "one", or "some" embodiment(s) in several locations, this does not necessarily mean that each such reference is to the same embodiment(s), or that the feature only applies to a single embodiment. Single features of different embodiments may also be combined to provide other embodiments. Therefore, all words and expressions should be interpreted broadly and they are intended to illustrate, not to restrict, each embodiment.

This application relates to quantification and compensation of reflections, scattering and other non-idealities within an OTA chamber in a MIMO OTA test set-up.

Figure 1:
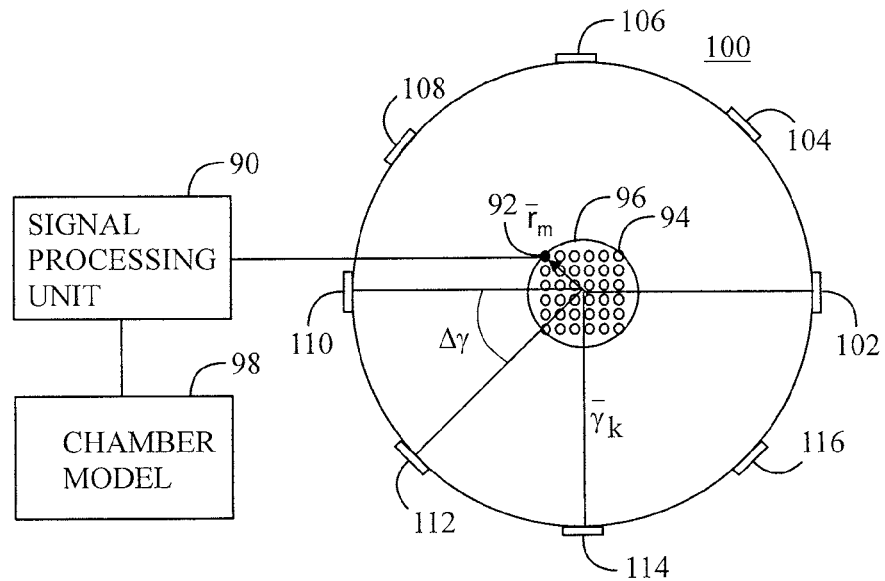
FIG. 1 shows a principle of calibration measurement plane geometrically.

FIG. 1 presents basic principles of calibration measurement in the OTA chamber two dimensionally. Although the OTA chamber 100 should cause no effect to the emulated radio channel, the emulated radio channel is actually distorted by reflections, scattering and diffraction based on interactions between the transmission from the OTA antennas 102 to 116 and various structures in the OTA chamber 100. A measuring arrangement for measuring the distortion caused by the OTA chamber 100 comprises a signal processing unit 90 and at least one calibration antenna 92 (black dot). The signal processing unit may be a part of the radio channel emulation system or a separate device. Often only one calibration antenna 92 is used. The calibration antenna 92 is placed in at least two positions 94 (white dots and the position of the black dot) in a test zone 96 surrounded by over-the-air antennas 102 to 116 of an over-the-air chamber 100 at different moments of time. The test zone 96 may be a quiet zone where the electric field provided by the OTA antennas 102 to 116 corresponds to the desired (theoretical) emulated radio channel and where a DUT (Device Under Test) is placed during the emulation. Hence, the similarity between the ideal radio channel and the realized radio channel in the quiet zone is high. The calibration antenna 92 may be placed in several positions inside or at the border of the quiet zone.

Calibration transmission may be transmitted from the OTA antennas 102 to 116. An emulator or some other transmitter may feed the calibration transmission to the OTA antennas 102 to 116. Calibration transmission comprises at least one predetermined signal. The signal may be a frequency sweep signal, for example. The sweep may be continuous or discrete.

In various positions, each calibration antenna 92 receives calibration transmission from the over-the-air antennas 102 to 116 via interactions between the calibration transmission and structures associated with the over-the-air chamber 100. The structures may comprise walls, cables, antenna stands and OTA antennas (which are not transmitting at that moment or at that code), for example. The interaction may include reflection, scattering and diffraction, for example. A reflection, for example, may be a first, second or a higher order reflection. The at least one calibration antenna 92 may not be used to measure a line-of-sight transmission or the line-of-sight measurement may be ignored since it is not based on undesired interaction and hence it does not cause distortion during the radio channel emulation.

The signal processing unit 90 is coupled with the at least one calibration antenna 92 and the signal processing unit 90 receives signals from each calibration antenna 92 in response to the reception of the calibration transmission while each of the at least one calibration antenna 92 is in least two positions. The signal processing unit 90 forms an OTA chamber model of the interactions on the basis of the received signals. The OTA chamber model is constant with respect to time. The signal processing unit 90 also stores the OTA chamber model in an OTA chamber model memory 98. The OTA chamber model memory 98 may be a part of the signal processing unit 90 or some other device. The OTA chamber model may be copied or moved to a memory of another device, too. The OTA channel model may be utilized when a radio frequency transmission from the over-the-air antennas 102 to 116 is predistorted in the over-the-air chamber 100 in order to cancel effects of the undesired interactions at least partly.

Figure 2:
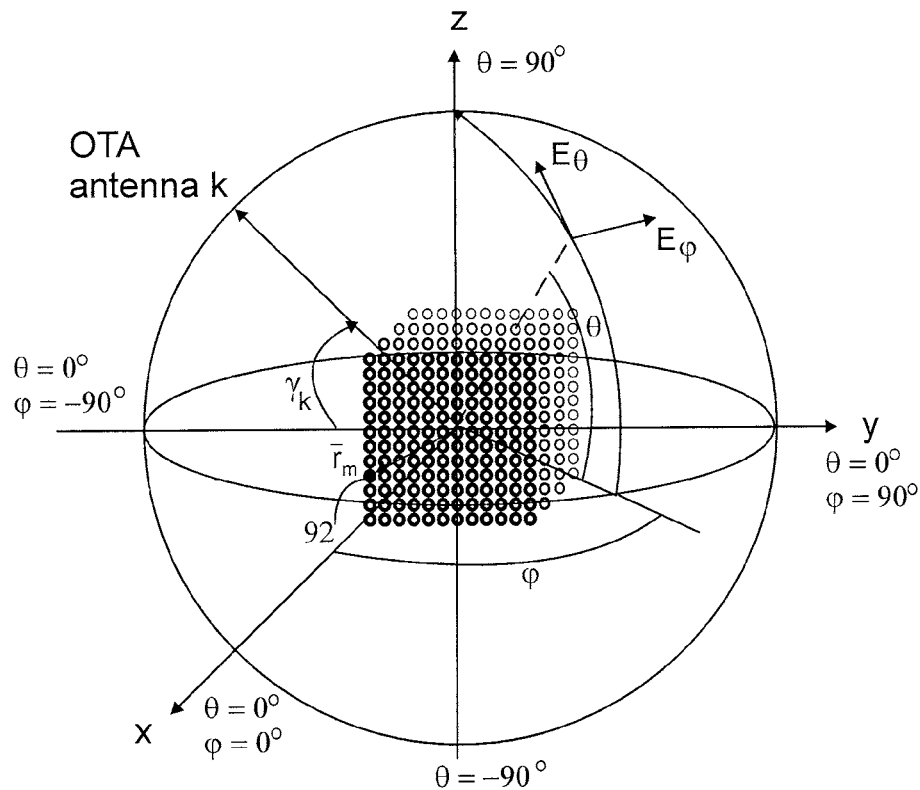
FIG. 2 presents a three dimensional configuration of the calibration measurement.

FIG. 2 presents a three dimensional configuration of the calibration measurement. There are K OTA antennas 102 to 116 in solid angle directions $\gamma_k=(\gamma_k, \theta_k)$ as shown in FIG. 2. Each solid angle direction may be expressed with two plane angles $\phi, \theta$, which may be orthogonal. If a plane geometrical measurement is performed, one of the angles $\phi, \theta$ is just omitted. The first direction $(\phi_1, \theta_1)$ may be chosen as the origin and the rest of the directions may be measured with respect to the first one.

In an embodiment, the calibration antenna 92 may be highly directive. In such a case, an opening angle of a beam of the calibration antenna 92 is narrow ($\Delta\phi=\Delta\theta=]0$ to $0.1]$ radians, for example).

In an embodiment, the calibration antenna 92 may be dual polarized such that its polarization isolation between orthogonal polarization directions is high, for example 20 dB or more.

In an embodiment, the calibration antenna 92 may be some kind of horn antenna with orthogonal polarizations.

Assume now for simplicity that only one calibration antenna 92 is used. Each OTA antenna 102 to 116 may transmit a calibration transmission separately. The transmissions of different OTA antennas 102 to 116 may be separated by time division and/or code division both in transmission and reception. In time division, each OTA antenna 102 to 116 transmits at different moment. In code division, each OTA antenna 102 to 116 transmits using a unique code the signals received may be distinguished by decoding the signals at reception. In the code division, several or all OTA antennas may transmit at the same time.

When calibration measurements at different positions $\bar{r}_m$ are performed for one OTA antenna 102 to 116, a next OTA antenna 102 to 116 may start transmission, for example. Alternatively, all OTA antennas 102 to 116 may transmit a calibration signal while the calibration antenna 92 is in one position. When all calibration measurements have been performed for that position, the calibration antenna 92 may be moved to another position and the measurement may be repeated.

Let's go through an example of a calibration measurement which includes a plurality of features. A calibration measurement may be performed with a calibration antenna 92 in a position m marked with a vector $\bar{r}_m$, m=1, ..., M, within the test zone 96. The calibration antenna may be rotated and the measurements may be performed in N solid angle directions $\Omega_n=(\phi_n, \theta_n)$. In the measurements, received complex amplitudes are measured. In each measurement, a position of the calibration antenna 92 and each direction may be recorded. Additionally or alternatively, complex amplitudes in two polarization directions $\Psi\epsilon\{E_\phi, E_\theta\}$ may be measured. The measurement may be performed at a plurality of frequencies $f_v$ instead of one frequency, v=1, ..., V, where V is an integer larger than 1. The measured frequencies may form a band (of discrete frequencies) or they may be pseudo-random or deterministic frequencies substantially separate from each other. The measurement is performed for each of the K OTA antennas' transmission separately. Finally, the calibration measurement gives a complex field matrix $E_{cal}(k, \Omega, \bar{r})\epsilon C^{K\times N\times M}$ for K OTA antennas with N directions and M locations, i.e. $C^{K\times N\times M}$ refers to complex values of K×N×M dimensions. Additionally or alternatively, the calibration measurement may give a complex field matrix for V frequencies and 2 polarizations ($E_\phi$ and $E_\theta$). Then the complete electric field matrix becomes $E_{cal}(k, \Psi, \Omega, f, \bar{r})\epsilon C^{K\times 2\times N\times V\times M}$ for K OTA antennas.

In some applications, information on frequencies and polarizations are not needed and hence they are not measured or they are ignored in the chamber model. Thus, the signal processing unit 90 may process the signals associated with the calibration transmission as a function of an over-the-air antenna and a direction. A time dependent variation does not need to be taken into account usually. Additionally or alternatively, the signal processing unit 90 may process the signals associated with the calibration transmission as a function of a frequency and a polarization.

The calibration measurement may be separable with respect to time, OTA antenna, direction, frequency and polarization. A radio channel impulse response in the calibration measurement is typically a single tap constant: $h(t,\tau)=\delta(t)$ (for example EB (Elektrobit) Propsim® F8). This matrix processing may be performed in the signal processing unit 90. The actual measurement may be performed using a vector network analyzator, for example. The signal processing may be performed using a suitable personal computer with a suitable computer program.

The maximum number of separate directions N is limited by the beam width of the calibration antenna 92, i.e. the result of $4\pi$st divided by the opening solid angle of the calibration antenna 92. It is not feasible to measure more than one sample within the beam width.

Usually, the purpose of the calibration measurement is to get spatial frequency responses which are based on reflections and other imperfections within the OTA chamber 100. Additionally or alternatively, the purpose of the calibration measurement is to get polarimetric frequency responses which are based on reflections and other imperfections within the OTA chamber 100.

The transmitted calibration signal has always an incidence angle $\gamma_k$, i.e. the direction of the measured OTA antenna. There is no need to perform the measurement at a direction $\Omega = \gamma_k$. Thus, the complex field $E_{cal}(k, \Psi, \Omega, f, \bar{r})$ doesn't need to contain the transmission in a direct path from OTA antenna k to the calibration antenna 92.

The calibration measurement can be interpreted as follows. When an OTA antenna k transmits with a radio channel emulator impulse response $h(t,\tau) = \delta(t)$ of the emulated radio channel, the electric field $E_{cal}$ in polarization $\Psi$, direction $\Omega$, frequency f and location $\bar{r}$ is $E_{cal}(k, \Psi, f, \bar{r})$.

The electric field matrix $E_{cal}(k, \Psi, \Omega, f, \bar{r}) \in C^{K \times 2 \times N \times V \times M}$ which is an OTA chamber model and which is formed on the basis of calibration measurement is stored for to be used in radio channel emulation. The calibration measurement may be done only once. Particularly this is true if the physical set-up in the OTA chamber is kept unchanged. In any case, the environment should be deterministic and time invariant for the calibration measurement to be successful.

Figure 3:
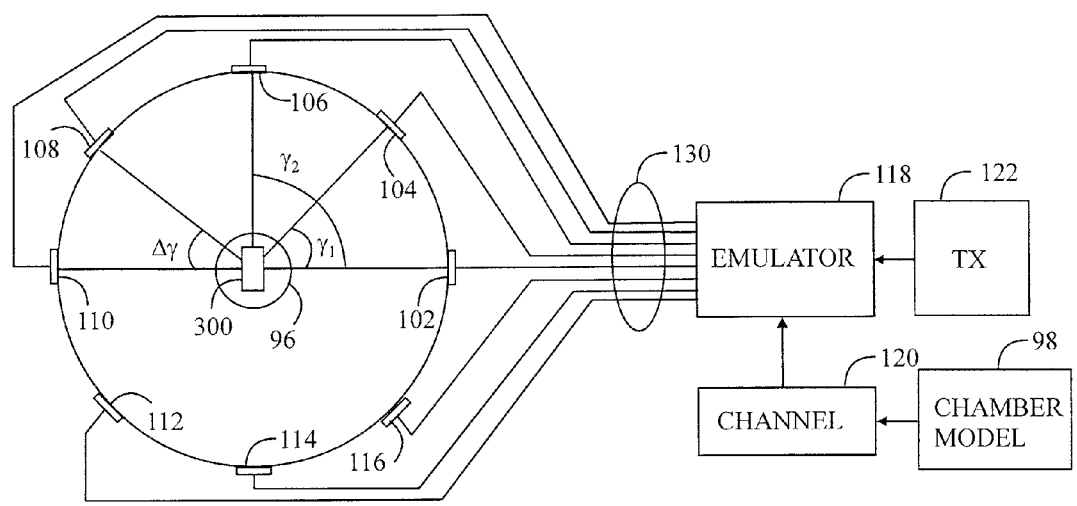
FIG. 3 presents radio channel emulation in the OTA chamber.

FIG. 3 presents emulation in the OTA chamber. FIG. 3 is two dimensional for clarity and simplicity. A DUT 300, which is an electrical device, is in the centre and over-the-air (OTA) antennas 102, 104, 106, 108, 110, 112, 114 and 116 may be around the DUT 300. The DUT 300 may be a computer or a subscriber terminal, for example. They may have a uniform spacing (e.g. 45° between each of the 8 elements). The DUT 300, in turn, may be in a test zone 96. The test zone 96 may be the same as a quiet zone. Let us denote the directions of K OTA antennas with $\gamma_k$, k=1, . . . , K and the spacing of an antenna in the angle domain with $\Delta\gamma$, where K refers to the number of OTA antennas 102 to 116. The angle $\Delta\gamma$ expresses a measure of the angular separation of two OTA antennas 102 to 116 with respect to the DUT 100. Each of the antenna elements may be connected to a single emulator output port of an emulator 118 such as EB (Elektrobit) Propsim® F8 and hence each antenna element may receive a signal through one signal path from the emulator 118.

The emulator 118 may comprise FIR filters for weighting and delaying each signal path 130 from the transmitter 122 to the antenna 102 to 116. Additionally or alternatively, the emulator 118 may comprise a processor, a memory and a suitable computer program for providing the OTA antennas 102 to 116 with the antenna channels.

The distance between the DUT 300 and the antenna elements 102 to 116 may be the same or the OTA antennas 102 to 116 may also be at different distances from the DUT 300. Correspondingly, the antenna elements 102 to 116 may only be placed in a sector instead of being placed at a full angle or a full solid angle. The OTA antennas 102 to 116 may also be movable. In any case, the positions of the OTA antennas 102 to 116 are predetermined at each moment with respect to the test zone 96 and their positions ought to correspond to positions of the calibration measurement.

The emulator 118 may be coupled to a transmitter 122 using an output connector of the transmitter 122. The transmitter 122 may be a base station of a radio system or the like. The DUT 300 may act as a receiving subscriber terminal of the radio system or the like. Antenna characteristics of the DUT 300 may be ignored.

A radio channel generator 120 may have a plurality of radio channel models in its memory or a radio channel may be formed in real time by hard ware, for example. A radio channel model may be a play back model based on a channel recorded from a real radio system or it may be an artificially generated model or it may be a combination of a playback model and an artificially generated model.

The radio channel generator 120 defines the environment in which the DUT 300 should receive communication signals from the transmitter 122. The radio channel generator 120 also has information on the configuration of the OTA antennas 102 to 116 with respect to the DUT 300 (distance from DUT, angle with respect to DUT and polarization of signals, for example). The radio channel generator 120 provides a weight for each signal path 130 from the emulator 118 to an antenna 102 to 116 on the basis of the predefined information with respect to the OTA antennas 102 to 116, a form of transmission from the OTA antennas 102 to 116, the desired electric field in the test zone 96, for example. If the weights are fed to the emulator 118 without taking into account the calibration measurement, they form a desired radio channel between the transmitter 122 and the DUT 300 with distortions.

However, the radio channel generator 120 has a radio channel model which is predistorted by the invert model formed during the calibration measurement. That is why the weights fed to the emulator 118 form a desired radio channel between the transmitter 122 and the DUT 300 without distortions or with less distortions.

In a MIMO (Multiple Input Multiple Output) radio channel emulation, the used radio channel model is known. From the radio channel model realizations it is possible to derive an instantaneous target field $E_t(\Psi, \Omega, f, \bar{r}, t)$ at a time instant t. Since the instantaneous target field $E_t(\Psi, \Omega, f, \bar{r}, t)$ is derivable, its approximate or exact form may be derived in several manners (see Equation (2)).

In a MIMO OTA, an electric field generation of each path from an antenna of the transmitter 122 to an OTA antenna 102 to 116 has a time variant impulse response. The impulse response depends on both the used radio channel model which is also predetermined and an OTA antenna position in the OTA chamber. Hence, an over-the-air antenna-specific element in the impulse response matrix contributes in a known manner to the electric field in the over-the-air chamber 100 and vice versa.

For simplicity of notation, assume now only one antenna for the transmitter 122. The impulse response can be (Fourier) transformed to a frequency response $H_{orig}(k, f, t)$. Thus, the signal transmitted from an OTA antenna k has a frequency response $H_{orig}(k, f, t)$ (in the radio channel emulator).

Now, the frequency response of the signal to be transmitted from antenna k is also known at each instant of time t. A distortion electric field matrix $E_{dist}$ may be formed on the basis of the frequency response $H_{orig}(k, f, t)$ and the electric field matrix $E_{cal}(k, \Psi, \Omega, f, \bar{r})$ generated by a transmission of an emulated radio channel. The antenna-specific distortion electric field $E_{dist}$ may be formed as a convolution of the frequency response $H_{orig}(k, f, t)$ and the measured chamber model $E_{cal}(k, \Psi, \Omega, f, \bar{r})$. The convolution may be expressed as a product of matrices $E_{cal}$ and elements of $H_{orig}$ in a frequency dimension. Hence, the signal processing unit or some (other) computationally capable part of the emulating system may form an antenna-specific distortion field $E_{dist}$ for each over-the-air antenna (OTA) 102 to 116 by weighting the measured chamber model $E_{cal}$ of an over-the-air antenna with an element $H_{k,t_j}(f_v)$ which belongs to a frequency response of a desired radio channel to be emulated and to the corresponding over-the-air antenna as follows:

$$E_{dist}(k_i, \Psi, \Omega, f_v, \bar{r}, t_j) = H_{k_i t_j}(f_v) \cdot E_{cal}(k_i, \Psi, \Omega, f_v, \bar{r}) \quad (1)$$

where $H_{k_i t_j}(f_v)$ is scalar (with fixed $k=k_i$, $f=f_v$ and $t=t_j$ it is possible to define a scalar $H_{orig}(k, f, t_j) = \{H_{k_i t_j}(f_v)\}_{v=1,\ldots,V}$), i is the $k^{th}$ OTA antenna's $i^{th}$ frequency response value. The distortion matrix may be calculated for all OTA antennas $k_j=1, \ldots, K$, and time instants $t_j=0, \ldots, T-1$ (T is the number of pre-generated impulse responses in the radio channel emulator). This equation may be also expressed as $$\begin{cases} E_t(E_\varphi, \Omega, f, \bar{r}, t) = \\ \sum_{k=1}^{K} H_{orig}(k, f, t) \|\bar{E}_{\varphi,k}\| \exp\left(-j2\pi \|\bar{r}_m + \bar{\theta}_k\| \frac{f_c+f}{c}\right) PL(\|\bar{r}+\bar{\theta}_k\|, f_c+f) \\ E_t(E_\theta, \Omega, f, \bar{r}, t) = \\ \sum_{k=1}^{K} H_{orig}(k, f, t) \|\bar{E}_{\theta,k}\| \exp\left(-j2\pi \|\bar{r}_m + \bar{\theta}_k\| \frac{f_c+f}{c}\right) PL(\|\bar{r}+\bar{\theta}_k\|, f_c+f) \end{cases} \quad (2)$$

where $\bar{E}_{\varphi,k}$ is the gain vector of $k_{th}$ OTA antenna with $E_\varphi$ polarization, "E"↓"(", k" is the gain vector of $k_{th}$ OTA antenna with $E_\theta$ polarization, $$\exp\left(-j2\pi \|\bar{r}_m + \bar{\theta}_k\| \frac{f_c+f}{c}\right)$$

is a phase term, $\bar{\theta}_k$ is a vector from OTA antenna k to the origin, c is the speed of light, $f_c$ is the carrier centre frequency, and PL(u,f) is the free space loss as a function of distance u (meters) and frequency f.

If frequency and/or polarization effects are ignored, they are just left out of the equations ($E_{dist}(k_i, \Omega, \bar{r}, t_j) = H_{k_i t_j} \cdot E_{cal}(k_i, \Omega, \bar{r}, t_j)$, where $H_{k_i t_j}$ is then a scalar constant). The resulting electric field due to interactions between the transmission of all the K OTA antennas 102 to 116 and the structures of the OTA chamber at a time instant t is a sum over the number of the OTA antennas 102 to 116

"E"↓"dist"ᵗ"tot"("(","(","f"↓"(",

"r,")"t")=E↓"dist"ᵗ"k" ⋮ "E" 
("k,"("","f"↓"(","","(","r,")"t") (3)

The measurement which is explained above may be simulated using a computer and a proper simulation program instead of really performing the measurement. The simulation requires parameters of the OTA chamber 100 such as its physical dimensions, for example. Additionally, information on OTA antennas 102 to 116, test zone 96 and the at least one calibration antenna 92 is needed. Various structures in and of the OTA chamber 100 may be simulated if their properties and positions are known i.e. have a measured value. Then a virtual OTA chamber may be created and a virtual measurement performed.

A simulation of a measurement may be performed using at least one processor and a memory including a computer program code, the at least one memory and the computer program code may, with the at least one processor, cause the simulation to provide at least one virtual calibration antenna placable in at least two virtual positions in a virtual test zone in a virtual over-the-air chamber including virtual over-the-air antennas which then may virtually transmit calibration transmission. At least one virtual calibration antenna at each virtual position may virtually receive the virtual calibration transmission of the virtual over-the-air antennas via virtual interactions between the virtual calibration transmission and virtual structures associated with the virtual over-the-air chamber. A channel model based on the virtually received signals may be formed and the chamber model may be stored in a memory for cancellation of effects of the undesired interactions by a predistortion of a radio frequency transmission from the over-the-air antennas in the over-the-air chamber.

The purpose is to cancel out the electric field formed by the undesired interactions between the transmission from the OTA antennas 102 to 116 and the structures in the OTA chamber 100. That may be achieved by creating an antipodal field $E_{anti}$=−"E"↓"dist"ᵗ"tot" ("(","(", ""f"↓"(" ",""(""r,")"t") which is an inverted form of the electric field caused by the undesired interactions in the OTA chamber 100. The sum effect of the undesired interactions and its inversion then becomes at least approximately zero, "E"↓"dist"ᵗ"tot" ("(","(", ""f"↓"(" ",""(""r,")"t")+"E"↓"anti"("(","(", "f"↓ "(" ","("r,")"t")≈0.

In the MIMO OTA system, the antipodal field may be created by the OTA antennas 102 to 116. The corresponding frequency responses $H_{anti}(k, f, t)$ for K OTA antennas may be determined. The antipodal field may be formed in a similar manner to the derivation of the instantaneous target field $E_t(\Psi, \Omega, f, \bar{r}, t)$ explained earlier. The antipodal field may be based on plane waves, for example. A weight for each signal path associated with an antenna of a plurality of OTA antennas 102 to 116 around a test zone 92 in an over-the-air chamber 100 may be formed by a comparison of a desired target electric field based on a radio channel model and an electric field obtainable by the plane waves associated with the test zone 92, the plane waves being transmittable by the OTA antennas 102 to 116. The target field here is zero. The use of the plane waves for creating a desired field is known per se, and it is explained in more detail in the patent application PCT/FI2011/050190. The plane waves may be synthesized in a following manner, for example. An equation to be solved may be FG=T, where F represents phase and path loss i.e.

$$\exp\left(-j2\pi \|\bar{r}_m + \bar{\theta}_k\| \frac{f_c+f}{c}\right) PL(\|\bar{r}+\bar{\theta}_k\|, f_c+f)$$

with or without $\|\bar{E}_{\varphi,k}\|$, G refers to $H_{anti}$ which is to be solved and which is the only unknown in the equation, and T refers to $E_{anti}$ which is based on measurements. Since the antipodal field is derivable, its approximate or exact form may be derived in several manners.

The final frequency response to be run by the radio channel emulator 118 is a combination of a frequency response $H_{orig}(k, f, t)$ of the original channel model and a frequency response $H_{anti}(k, f, t)$ of the invert model as follows:

$$H(k,f,t) = H_{orig}(k,f,t) + H_{anti}(k,f,t). \quad (4)$$

The addition operation (+) represents the pre-distortion by which the invert model $H_{anti}$ pre-distorts the radio channel $H_{orig}$. Hence, a radio channel model $H_{orig}(k, f, t)$ is pre-distorted by the chamber model the inverted model of which is represented by the frequency response $H_{anti}(k, f, t)$.

The invert model may be iterated in the signal processing unit 90 by forming and storing a next invert model in response to a calibration transmission predistorted by the present invert model. However, if the reflections or the like are weak compared to the desired signals, $|H_{orig}(k, f,$ t)|>>|H$_{anti}$(k, f, t)|, iterative processing is not necessarily required. On the other hand, if the reflections or the like are strong and the frequency response to be used is affected too much by the distortion |(H$_{orig}$(k, f, t)|≈|H$_{anti}$(k, f, t)| or |H$_{orig}$(k, f, t)|<|H$_{anti}$(k, f, t)|, the process of calculating the invert model may be repeated.

Figure 4:
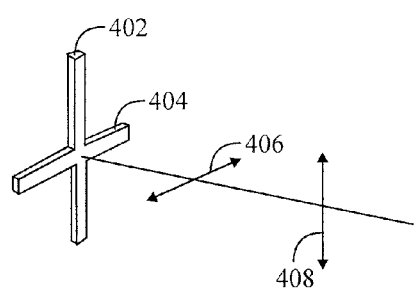
FIG. 4 shows an antenna with two polarization planes.

In an embodiment, polarization may be taken into account. FIG. 4 presents an antenna having antenna elements 402, 404 for two orthogonal polarizations. Orthogonal polarization components 406, 408 (e.g. vertical V and horizontal H) may be created independently by two co-located and orthogonally polarized OTA antenna elements, for example.

With the invert model it may be possible to use a lower quality chamber which is technically less challenging and more economical. It may be possible to use a normal room as a facility for MIMO OTA radio channel testing.

Figure 5:
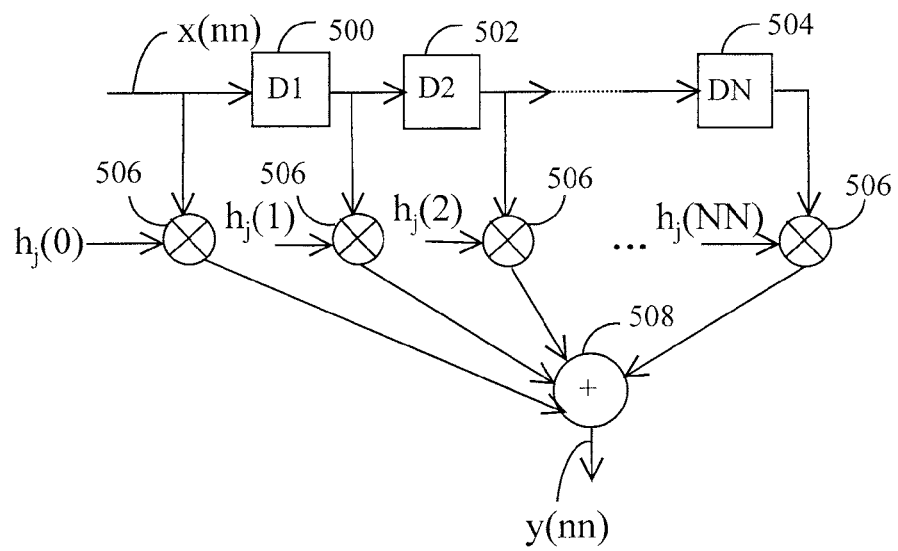
FIG. 5 shows a structure of a FIR filter.

FIG. 5 shows a block diagram of a FIR filter which may comprise delay elements 500 to 504 arranged as a shift register, multipliers 506 and a summer 508. The basic function of an FIR filter may be described as follows. The digital input signal x(nn), which may be the signal from the transmitter 122, is delayed in each delay element 500 to 504, whose delays may have the same or different length in time, and the delayed signals are multiplied in the multipliers 506 by the desired weights h$_j$(ii) formed by the radio channel generator 120, where j=[1, KK]. The weights in a signal path from a transmitter 122 to OTA antennas 102 to 116 may be H$_j$=[h(0), . . . , h(MM)], which are also called tap coefficients of a FIR filter. The signal components are summed together in a summer 508. The delay dispersion may be controlled by weighting different delays of the input signals x(nn) differently.

In a mathematical form, the output signal y(nn) of a FIR filter may be expressed as a convolution of the sum of the product of the delayed signal and the weights h(k):

$$y(nn) = x^*h = \sum_{k=1}^{NN} h(k)x(nn-k),$$

where * denotes a convolution operation and n denotes the index of a signal element. Signals x and y and a weight h may be processed in a scalar form, vector form or matrix form. Generally, weights h may be real or complex.

Figure 6:
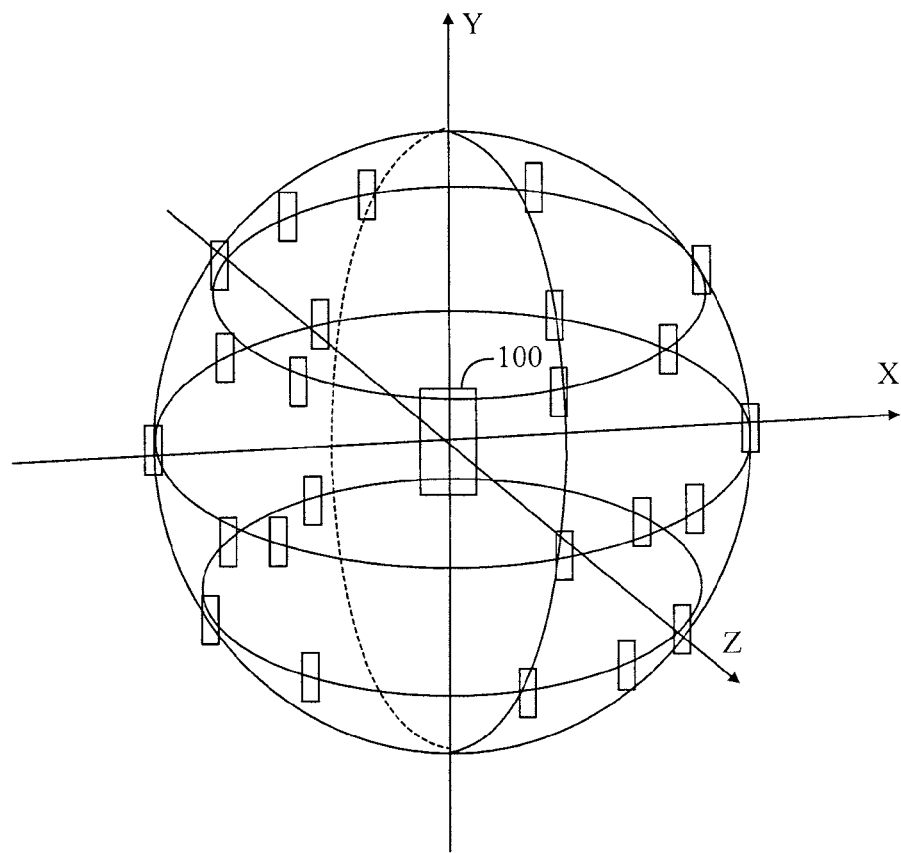
FIG. 6 shows three dimensional radio channel emulation.

FIG. 6 presents a solid geometrical embodiment of an OTA test chamber. In this example, the antenna elements (rectangles) are placed (as if) on a surface of a sphere while the DUT 300 is in the middle of the sphere. However, the surface on which the antenna elements are (as if) placed may be a part of any surface which encloses a volume. Examples of such surfaces are a surface of a cube, an ellipsoid, a tetrahedra, etc.

Figure 7:
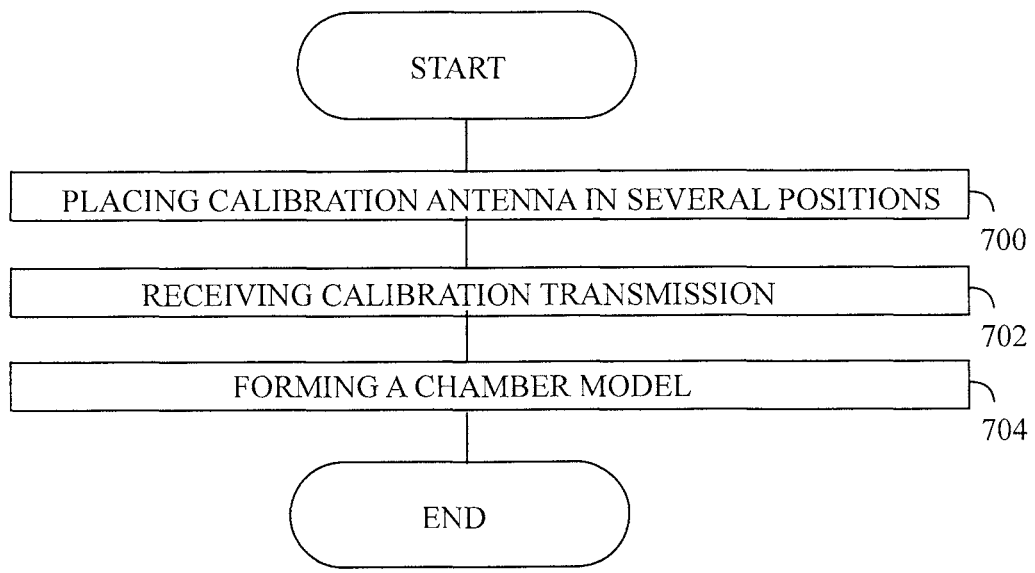
FIG. 7 shows a flow chart of a method of calibration measurement.

FIG. 7 presents a flow chart of the method of forming an invert model of the OTA chamber. In step 700, at least one calibration antenna is placed in at least two positions in a test zone in an over-the-air chamber including over-the-air antennas. In step 702, calibration transmission of the over-the-air antennas via interactions between the calibration transmission and structures associated with the over-the-air chamber at each position is received by the at least one calibration antenna. In step 704, a chamber model with the interactions on the basis of the received signals is formed by a signal processing, and the chamber model is stored in a memory for a cancellation of effects of the undesired interactions by a predistortion of a radio frequency transmission from the over-the-air antennas in the over-the-air chamber.

Figure 8:
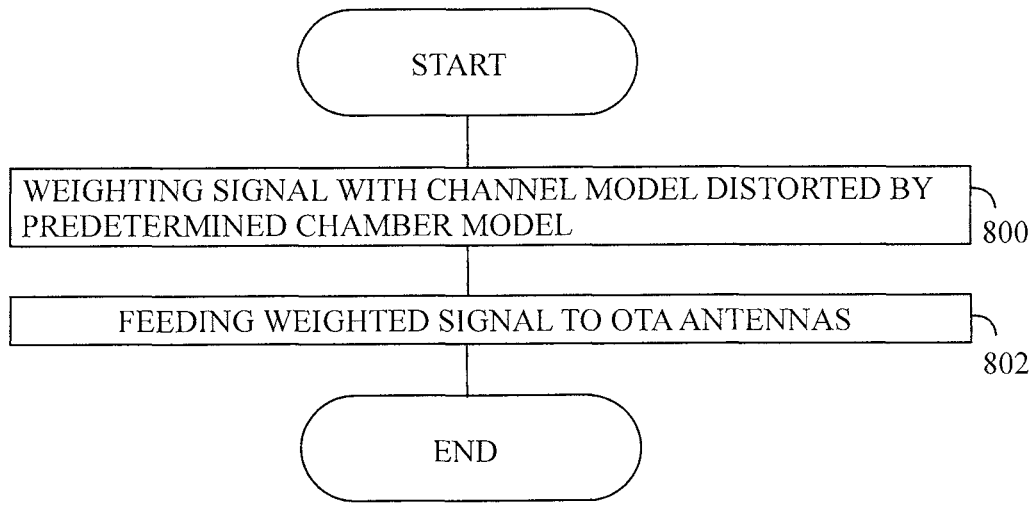
FIG. 8 a flow chart of a method of performing radio channel emulation.

FIG. 8 presents a flow chart of the method of performing a radio channel emulation with an invert model of the OTA chamber. In step 800, a communication signal is weighted in an emulator with the radio channel model distorted by a predetermined chamber model formed in the method described FIG. 7. In step 802, the weighted communication signal is fed to over-the-air antennas for transmission to a device under test.

An embodiment provides a computer program embodied on a distribution medium, comprising program instructions which, when loaded into an electronic apparatus, execute the method described above in connection with FIGS. 7 and 8.

The computer program may be in source code form, object code form, or in some intermediate form, and it may be stored in some sort of carrier, which may be any entity or device capable of carrying the program. Such carriers include a record medium, computer memory, read-only memory, and software distribution package, for example. Depending on the processing power needed, the computer program may be executed in a single electronic digital computer or it may be distributed amongst a number of computers.

It will be obvious to a person skilled in the art that, as technology advances, the inventive concept can be implemented in various ways. The invention and its embodiments are not limited to the examples described above but may vary within the scope of the claims.

What is claimed is:

1. An apparatus comprising:
a signal processing unity; and
at least one calibration antenna placable in at least two positions in a test zone in an over-the-air chamber including over-the-air antennas, the at least one calibration antenna, at each position, being configured to receive calibration transmission from the over-the-air antennas via undesired interactions between the calibration transmission and structures associated with the over-the-air chamber, and the signal processing unit being configured to receive signals from the at least one calibration antenna of the at least two positions in response to a reception of the calibration transmission, form a chamber model with the undesired interactions based on the received signals, and store the chamber model for a cancellation of effects of the undesired interactions by a predistortion of a radio frequency transmission from the over-the-air antennas in the over-the-air chamber; and
wherein the signal processing unit is configured to form a distortion electric field by a convolution of a measured chamber model and a frequency response of a desired radio channel to be emulated, an inversion of the distortion electric field, a formation of a frequency response based on an inverted distortion electric field, and a combination of the frequency response of the desired radio channel to be emulated and the frequency response associated with the inverted distortion electric field for a cancellation of effects of the undesired interactions during emulation.

2. The apparatus of claim 1, wherein the signal processing unit is configured to iterate the chamber model by a formation and a storage of a next chamber model in response to a calibration transmission predistorted based on a present chamber model.

3. The apparatus of claim 1, wherein the signal processing unit is configured to combine antenna-specific distortion electric fields of the over-the-air antennas for forming the distortion electric field.

4. The apparatus of claim 3, wherein the signal processing unit is configured to form an antenna-specific distortion field for each over-the-air antenna by a weighting operation between a measured chamber model of an over-the-air antenna and an element which belongs to a frequency response of a desired radio channel to be emulated and to a corresponding over-the-air antenna.

5. The apparatus of claim 1, wherein the signal processing unit is configured to process the signals and form and store the chamber model as a function of an over-the-air antenna and a direction of the reception of the at least one calibration antenna.

6. The apparatus of claim 5, wherein the signal processing unit is configured to additionally process the signals and form and store the chamber model as a function of a frequency and a direction of polarization.

7. The apparatus of claim 1, wherein the signal processing unit is configured to separate the signals associated with a calibration transmission of different over-the-air antennas from each other based on a time division or a code division.

8. An emulation system comprising:
a radio channel generator having a radio channel model predistorted based on a predetermined chamber model;
a plurality of over-the-air antennas;
an emulator coupled to the radio channel generator to receive weights of the radio channel model predistorted based on the chamber model; and
a transmitter coupled to the emulator for feeding a communication signal to the emulator, the emulator being configured to weight the communication signal with the radio channel model predistorted based on the chamber model, the over-the-air antennas being configured to receive the weighted communication signal for a transmission to a device under test, wherein the radio channel generator is configured to form the weights by a formation of a distortion electric field by a convolution of a measured chamber model and a frequency response of the radio channel to be emulated, an inversion of the distortion electric field, a formation of a frequency response of the inversion of the distortion electric field, and a combination of the frequency response of the radio channel to be emulated and the frequency response of the inversion of the distortion electric field.

9. The emulation system of claim 8, wherein the radio channel generator comprises a radio channel model predistorted based on the chamber model.

10. The emulation system of claim 8, wherein the radio channel generator comprises a radio channel model predistorted based on a chamber model formed by a simulation.

11. A method comprising:
placing at least one calibration antenna in at least two positions in a test zone in an over-the-air chamber including over-the-air antennas;
receiving, by the at least one calibration antenna, calibration transmission of the over-the-air antennas via interactions between the calibration transmission and structures associated with the over-the-air chamber at each position; and
forming, by a signal processing, a chamber model with the interactions based on received signals,
storing, in a memory, the chamber model for a cancellation of effects of undesired interactions by a predistortion of a radio frequency transmission from the over-the-air antennas in the over-the-air chamber;
forming a distortion electric field by convoluting the chamber model with a frequency response of a desired radio channel to be emulated;
inverting the distortion electric field;
forming a frequency response based on the inverted distortion electric field; and
combining the frequency response of the desired radio channel to be emulated with the frequency response associated with the inverted distortion electric field for a cancellation of effects of the undesired interactions during emulation.

12. The method of claim 11, the method further comprising iterating the chamber model by forming and storing a next chamber model in response to a calibration transmission predistorted based on a present chamber model.

13. The method of claim 11, further comprising combining antenna-specific distortion electric fields of the over-the-air antennas for forming the distortion electric field.

14. The method of claim 13, further comprising forming an antenna-specific distortion field for each over-the-air antenna by weighting the measured chamber model of an over-the-air antenna with an element which belongs to a frequency response of a desired radio channel to be emulated and to a corresponding over-the-air antenna.

15. The method of claim 11, the method further comprising:
processing the signals; and
forming and storing the chamber model as a function of an over-the-air antenna and a direction of receptions of the at least one calibration antenna.

16. The method of claim 11, the method further comprising processing the signals and forming and storing the chamber model as a function of a frequency and a polarization.

17. The method of claim 11, the method further comprising separating the signals associated with a calibration transmission of different over-the-air antennas from each other based on a time division or a code division.

18. A method of performing radio channel emulation in an over-the-air chamber, the method comprising:
weighting a communication signal in an emulator with a radio channel model distorted based on a predetermined chamber model; and
feeding the weighted communication signal to over-the-air antennas for transmission to a device under test, wherein weights are formed for the weighting by:
forming a distortion electric field by convoluting the chamber model with a frequency response of a desired radio channel to be emulated;
inverting the distortion electric field;
forming a frequency response based on the inverted distortion electric field; and
combining the frequency response of the desired radio channel to be emulated with the frequency response associated with the inverted distortion electric field for a cancellation of effects of undesired interactions during emulation.

19. The method of claim 18, the method further comprising weighting the communication signal in the emulator with the radio channel model distorted based on the chamber model.

20. The method of claim 18, the method further comprising weighting the communication signal in the emulator with the radio channel model distorted based on a chamber model formed by a simulation.

21. The method of claim 18, the method further comprising weighting the communication signal as a function of the over-the-air antenna and a direction of receptions of the at least one calibration antenna.

22. The method of claim 18, the method further comprising weighting the communication signal as a function of a frequency and a polarization.

23. A measurement arrangement comprising:
- at least one calibration antenna placable in at least two positions in a test zone in an over-the-air chamber including over-the-air antennas;
- at least one processor; and
- a memory including a computer program code, the memory and the computer program code configured to, with the at least one processor, cause the measurement arrangement to at least:
- transmit, by the over-the-air antennas, calibration transmission;
- receive, by the at least one calibration antenna at each position, the calibration transmission of the over-the-air antennas via interactions between the calibration transmission and structures associated with the over-the-air chamber;
- form and to store a chamber model with the interactions in a chamber model memory based on the received signals for a cancellation of effects of undesired interactions by a predistortion of a radio frequency transmission from the over-the-air antennas in the over-the-air chamber;
- form a distortion electric field by convoluting the chamber model with a frequency response of a desired radio channel to be emulated;
- invert the distortion electric field;
- form a frequency response based on the inverted distortion electric field; and
- combine the frequency response of the desired radio channel to be emulated with the frequency response associated with the inverted distortion electric field for a cancellation of effects of the undesired interactions during emulation.

* * * * *